(12) United States Patent
Goto et al.

(10) Patent No.: US 10,676,841 B2
(45) Date of Patent: Jun. 9, 2020

(54) SEMICONDUCTOR SUBSTRATE, EPITAXIAL WAFER, AND METHOD FOR MANUFACTURING EPITAXIAL WAFER

(71) Applicants: TAMURA CORPORATION, Tokyo (JP); NATIONAL UNIVERSITY CORPORATION TOKYO UNIVERSITY OF AGRICULTURE AND TECHNOLOGY, Tokyo (JP)

(72) Inventors: Ken Goto, Tokyo (JP); Akinori Koukitu, Tokyo (JP); Yoshinao Kumagai, Fuchu (JP); Hisashi Murakami, Fuchu (JP)

(73) Assignees: TAMURA CORPORATION, Tokyo (JP); NATIONAL UNIVERSITY CORPORATION TOKYO UNIVERSITY OF AGRICULTURE AND TECHNOLOGY, Tokyo (JP)

(*) Notice: Subject to any disclaimer, the term of this patent is extended or adjusted under 35 U.S.C. 154(b) by 445 days.

(21) Appl. No.: 15/309,956

(22) PCT Filed: May 11, 2015

(86) PCT No.: PCT/JP2015/063523
§ 371 (c)(1),
(2) Date: Nov. 9, 2016

(87) PCT Pub. No.: WO2015/170774
PCT Pub. Date: Nov. 12, 2015

(65) Prior Publication Data
US 2017/0145590 A1    May 25, 2017

(30) Foreign Application Priority Data
May 9, 2014   (JP) .................................. 2014-097751

(51) Int. Cl.
*C30B 25/20*   (2006.01)
*C30B 29/16*   (2006.01)
(Continued)

(52) U.S. Cl.
CPC .............. *C30B 25/20* (2013.01); *C23C 16/44* (2013.01); *C30B 29/16* (2013.01);
(Continued)

(58) Field of Classification Search
CPC ......... C30B 25/20; C30B 29/16; C23C 16/44; H01L 21/02414; H01L 21/0228;
(Continued)

(56) References Cited

U.S. PATENT DOCUMENTS 9,142,623 B2   9/2015   Sasaki
9,437,689 B2   9/2016   Sasaki et al.
(Continued)

FOREIGN PATENT DOCUMENTS

CN    1983555 A    6/2007
CN    103781948 A   5/2014
(Continued)

OTHER PUBLICATIONS

Murakami et al., "Homoepitaxial growth of β-Ga2O3 layers by halide vapor phase epitaxy", Applied Physics Express, vol. 8, 2015, pp. 015503). (Year: 2015).*
(Continued)

*Primary Examiner* — Jonathan C Langman
(74) *Attorney, Agent, or Firm* — Scully Scott Murphy and Presser

(57) ABSTRACT

A semiconductor substrate for being used as a base substrate for epitaxial crystal growth by HVPE method includes a $\beta$-$Ga_2O_3$-based single crystal, and a principal surface that is a plane parallel to a [010] axis of the $\beta$-$Ga_2O_3$-based single crystal. An epitaxial wafer includes the semiconductor sub-
(Continued)

strate, and an epitaxial layer that includes a β-Ga$_2$O$_3$-based single crystal and is formed on the principal surface of the semiconductor substrate by epitaxial crystal growth using the HVPE method. A method for manufacturing the epitaxial wafer includes forming the epitaxial layer by epitaxial crystal growth using the HVPE method on the semiconductor substrate.

4 Claims, 8 Drawing Sheets

(51) Int. Cl.
H01L 21/205 (2006.01)
C23C 16/44 (2006.01)
H01L 21/02 (2006.01)
H01L 29/04 (2006.01)
H01L 29/24 (2006.01)

(52) U.S. Cl.
CPC .... *H01L 21/0262* (2013.01); *H01L 21/02414* (2013.01); *H01L 21/02428* (2013.01); *H01L 21/02433* (2013.01); *H01L 21/02565* (2013.01); *H01L 21/02598* (2013.01); *H01L 21/02634* (2013.01); *H01L 21/205* (2013.01); *H01L 29/045* (2013.01); *H01L 29/24* (2013.01)

(58) Field of Classification Search
CPC ......... H01L 21/02433; H01L 21/02565; H01L 21/02598; H01L 21/0262; H01L 21/02634; H01L 21/205; H01L 29/045; H01L 29/24

See application file for complete search history.

(56) References Cited

U.S. PATENT DOCUMENTS

| | | | |
|---|---|---|---|
| 9,461,124 | B2 | 10/2016 | Sasaki et al. |
| 9,685,515 | B2 | 6/2017 | Sasaki |
| 9,716,004 | B2 | 7/2017 | Sasaki |
| 2007/0134833 | A1 | 6/2007 | Ikemoto et al. |
| 2010/0270548 | A1 | 10/2010 | Ikemoto et al. |
| 2011/0198562 | A1* | 8/2011 | Moon .................. H01L 33/007 257/13 |
| 2014/0217405 | A1* | 8/2014 | Sasaki ................ H01L 29/7813 257/43 |
| 2014/0217469 | A1 | 8/2014 | Sasaki et al. |
| 2014/0217554 | A1* | 8/2014 | Sasaki ..................... C30B 29/16 257/616 |
| 2014/0239452 | A1 | 8/2014 | Sasaki |
| 2016/0233307 | A1 | 8/2016 | Sasaki |
| 2016/0265137 | A1 | 9/2016 | Goto et al. |
| 2016/0300953 | A1 | 10/2016 | Sasaki et al. |
| 2016/0365418 | A1 | 12/2016 | Sasaki et al. |

FOREIGN PATENT DOCUMENTS

| | | |
|---|---|---|
| CN | 105992841 A | 10/2016 |
| EP | 3054037 A1 | 8/2016 |
| JP | 2013-227202 A | 11/2013 |
| JP | 2013-229554 A | 11/2013 |
| JP | 2015-091740 A | 5/2015 |
| WO | 2013035472 A1 | 3/2013 |
| WO | 2013035842 A1 | 3/2013 |
| WO | 2013035845 A1 | 3/2013 |
| WO | WO 2013/035464 A1 | 3/2013 |

OTHER PUBLICATIONS

Japanese Official Action dated Jul. 18, 2017 from related JP 2014-097751 together with English language translation.
Taiwan Official Action dated Aug. 2, 2018 from related TW 104114927 together with English language translation.
Chinese Official Action dated May 18, 2018 from related CN201580024046.X together with English language translation.
Mori, et al., "Vapor-Phase Epitaxial Growth of Ga2O3", University of Tokyo faculty-of-technology synthesis experiment station annual report, vol. 35, Jun. 30, 1976, pp. 155-161 together with English language translation.
International Preliminary Report on Patentability and Written Opinion dated Nov. 24, 2016 issued in PCT/JP2015/063523.
International Search Report dated Aug. 11, 2015 issued in PCT/JP2015/063523.
Sasaki et al., "MBE GROWN Ga2O3, and its power device applications", Journal of Crystal Growth, vol. 378, Sep. 1, 2013, pp. 591-595.
Extended European Search Report dated Dec. 13, 2017 received from the EPO in related EP 15 789 328.0.

* cited by examiner

SEMICONDUCTOR SUBSTRATE, EPITAXIAL WAFER, AND METHOD FOR MANUFACTURING EPITAXIAL WAFER

TECHNICAL FIELD

The invention relates to a semiconductor substrate, an epitaxial wafer and a method for manufacturing the epitaxial wafer.

BACKGROUND ART

A technique of forming a $\beta$-$Ga_2O_3$ single crystal film on a $\beta$-$Ga_2O_3$-based substrate by epitaxial crystal growth using the MBE (Molecular Beam Epitaxy) method is conventionally known (see, e.g., PTL 1).

According to PTL 1, the $\beta$-$Ga_2O_3$ single crystal film can be grown at a high growth rate by the MBE method when the plane orientation of the principal surface of the $\beta$-$Ga_2O_3$-based substrate is adjusted to a predetermined plane orientation.

CITATION LIST

Patent Literature

[PTL 1]
WO 2013/035464

SUMMARY OF INVENTION

Technical Problem

It is an object of the invention to provide a semiconductor substrate comprising a $\beta$-$Ga_2O_3$ single crystal that allows an epitaxial layer comprising a $\beta$-$Ga_2O_3$ single crystal to grow thereon at a high growth rate using the HVPE method; an epitaxial wafer comprising the semiconductor substrate and an epitaxial layer; and a method for manufacturing the epitaxial wafer.

Solution to Problem

According to an embodiment of the invention, in order to attain the object, a semiconductor substrate defined by [1] to [4] below is provided.

[1] A semiconductor substrate for being used as a base substrate for epitaxial crystal growth by HVPE method, the semiconductor substrate comprising:
a $\beta$-$Ga_2O_3$-based single crystal; and
a principal surface that is a plane parallel to a [010] axis of the $\beta$-$Ga_2O_3$-based single crystal.

[2] The semiconductor substrate according to [1], wherein the principal surface is a plane rotated by an angle within a range of not less than 38° and not more than 90° from a (100) plane toward a (101) plane about a rotational axis the [010] axis of the $\beta$-$Ga_2O_3$-based single crystal.

[3] The semiconductor substrate according to [2], wherein the angle is 68±10°.

[4] The semiconductor substrate according to [2], wherein the angle is 38±1°, 53.8±1°, 68±1°, 76.3±1°, 77.3±1°, 83±1° or 90±1°.

According to another embodiment of the invention, in order to attain the object, an epitaxial wafer defined by [5] below is provided.

[5] An epitaxial wafer, comprising:
the semiconductor substrate according to any one of [1] to [4]; and
an epitaxial layer that comprises a $\beta$-$Ga_2O_3$-based single crystal and is formed on the principal surface of the semiconductor substrate by epitaxial crystal growth using the HVPE method.

According to another of the invention, in order to attain the object, a method for manufacturing an epitaxial wafer defined by [6] to [10] below is provided.

[6] A method for manufacturing an epitaxial wafer, comprising forming an epitaxial layer that comprises a $\beta$-$Ga_2O_3$-based single crystal by epitaxial crystal growth using HVPE method on a semiconductor substrate comprising a $\beta$-$Ga_2O_3$-based single crystal, and a principal surface that is a plane parallel to a [010] axis of the $\beta$-$Ga_2O_3$-based single crystal.

[7] The method for manufacturing an epitaxial wafer according to [6], wherein a growth rate of the epitaxial layer is not less than 1.2 µm/h.

[8] The method for manufacturing an epitaxial wafer according to [6] or [7], wherein the principal surface of the semiconductor substrate is a plane rotated by an angle within a range of not less than 38° and not more than 90° from a (100) plane toward a (101) plane about the [010] axis of the $\beta$-$Ga_2O_3$-based single crystal.

[9] The method for manufacturing an epitaxial wafer according to [8], wherein the angle is 68±10°.

[10] The method for manufacturing an epitaxial wafer according to [8], wherein the angle is 38±1°, 53.8±1°, 68±1°, 76.3±1°, 77.3±1°, 83±1° or 90±1°.

Advantageous Effects Of Invention

According to the invention, a semiconductor substrate comprising a $\beta$-$Ga_2O_3$ single crystal that allows an epitaxial layer comprising a $\beta$-$Ga_2O_3$ single crystal to grow thereon at a high growth rate using the HVPE method, an epitaxial wafer comprising the semiconductor substrate and an epitaxial layer, and a method for manufacturing the epitaxial wafer can be provided.

DESCRIPTION OF EMBODIMENTS

[First Embodiment]
(Configuration of Crystalline Layered Structure)

Figure 1:
FIG. 1 is a vertical cross-sectional view showing an epitaxial wafer in a first embodiment.

FIG. 1 is a vertical cross-sectional view showing an epitaxial wafer 10 in the first embodiment. The epitaxial wafer 10 has a semiconductor substrate 11 and an epitaxial layer 12 formed on a principal surface of the semiconductor substrate 11 by epitaxial crystal growth using the HVPE (Halide Vapor Phase Epitaxy) method.

The semiconductor substrate 11 is a substrate formed of a $\beta$-$Ga_2O_3$-based single crystal. The $\beta$-$Ga_2O_3$-based single crystal here means a $\beta$-$Ga_2O_3$ single crystal or a crystal of which base crystal is a $\beta$-$Ga_2O_3$ single crystal doped with an element such as Al or In. The composition of the $\beta$-$Ga_2O_3$ single crystal doped with, e.g., Al and In is expressed by $\beta$-$(Ga_xAl_yIn_{(1-x-y)})_2O_3$ ($0<x\leq1$, $0\leq y\leq1$, $0<x+y\leq1$). The band gap of the $\beta$-$Ga_2O_3$ single crystal is widened by adding Al and is narrowed by adding In. The semiconductor substrate 11 may also contain a conductive impurity such as Si.

To form the semiconductor substrate 11, for example, a bulk crystal of a $Ga_2O_3$-based single crystal grown by, e.g., a melt-growth technique such as the FZ (Floating Zone) method or the EFG (Edge Defined Film Fed Growth) method is sliced and the surface thereof is then polished.

The principal surface of the semiconductor substrate 11 is a plane parallel to a [010] axis of the $\beta$-$Ga_2O_3$-based single crystal which constitutes the semiconductor substrate 11. This is determined based on the finding by the present inventors that a growth rate of a $\beta$-$Ga_2O_3$-based single crystal layer epitaxially grown by the HVPE method is extremely low when the principal surface of the $\beta$-$Ga_2O_3$-based single crystal substrate has a plane orientation of (010).

The present inventors found that the growth rate of a $\beta$-$Ga_2O_3$-based single crystal layer epitaxially grown by the HVPE method is high when the plane orientation of the principal surface of the $\beta$-$Ga_2O_3$-based single crystal substrate is perpendicular to a (010) plane which is not suitable for growing the $\beta$-$Ga_2O_3$-based single crystal layer using the HVPE method, i.e., when the principal surface is a plane parallel to the [010] axis.

Preferably, the principal surface of the semiconductor substrate 11 is a plane rotated by an angle within a range of not less than 38° and not more than 90° from a (100) plane toward a (101) plane about the [010] axis of the $\beta$-$Ga_2O_3$-based single crystal.

More preferably, the principal surface of the semiconductor substrate 11 is a plane rotated by 68±10° from a (100) plane toward a (101) plane about the [010] axis of the $\beta$-$Ga_2O_3$-based single crystal. "±" here indicates the tolerance and 68±10°, for example, means a given angle within a range of not less than 58° and not more than 78°.

It is also preferable that the principal surface of the semiconductor substrate 11 be a plane rotated by 38±1°, 53.8±1°, 68±1°, 76.3±1°, 77.3±1°, 83±1° or 90±1° from a (100) plane toward a (101) plane about the [010] axis of the $\beta$-$Ga_2O_3$-based single crystal.

The epitaxial layer 12 is formed of a $\beta$-$Ga_2O_3$-based single crystal in the same manner as the semiconductor substrate 11. The epitaxial layer 12 may also contain a conductive impurity such as Si.

(Structure of Vapor Phase Deposition System)

A structure of a vapor phase deposition system used for growing the epitaxial layer 12 in the present embodiment will be described below as an example.

Figure 2:
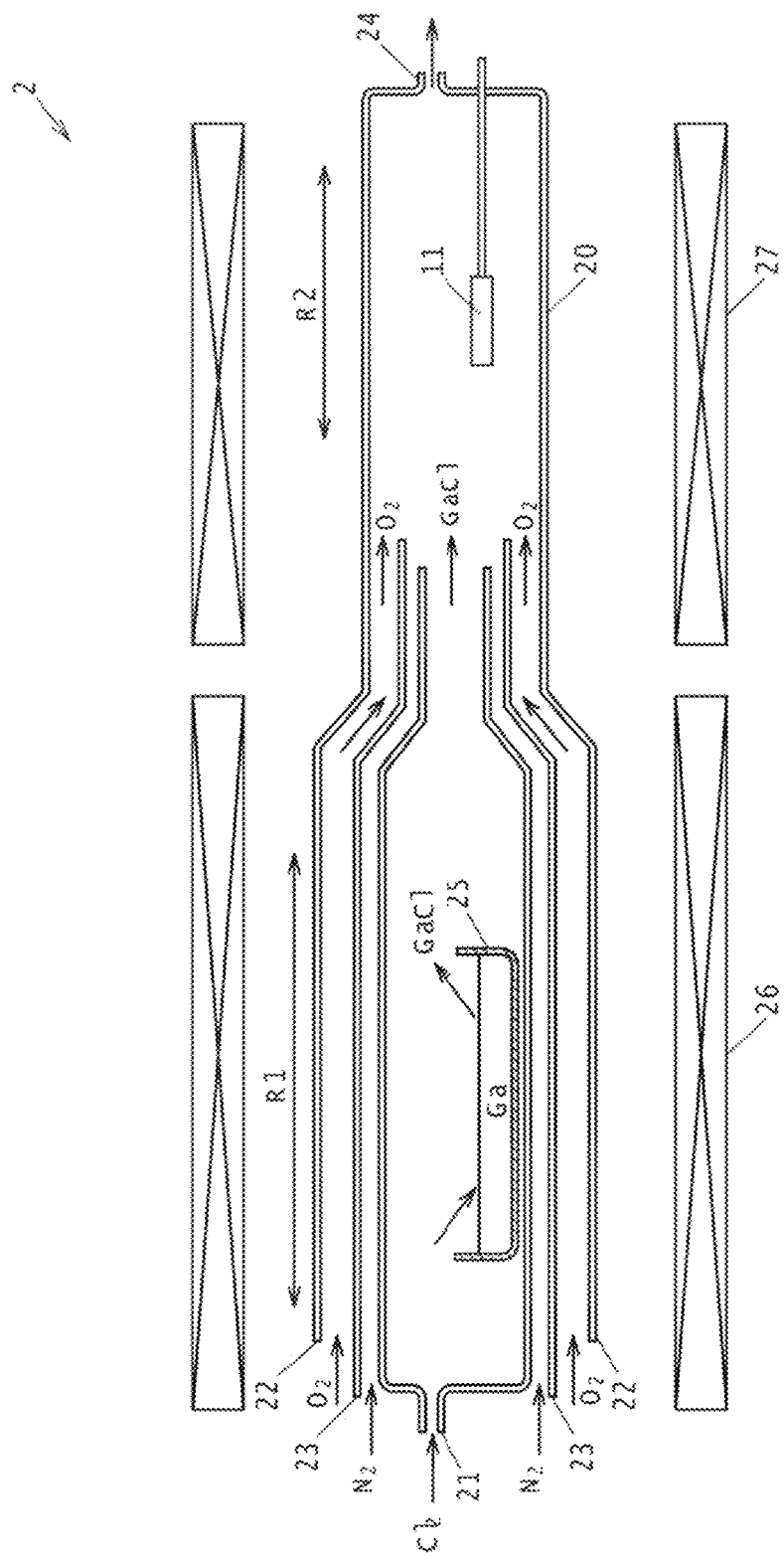
FIG. 2 is a vertical cross-sectional view showing a vapor phase deposition system in the embodiment.

FIG. 2 is a vertical cross-sectional view showing a vapor phase deposition system 2 in the embodiment. The vapor phase deposition system 2 is a vapor phase deposition system using HVPE technique, and has a reaction chamber 20 having a first gas introducing port 21, a second gas introducing port 22, a third gas introducing port 23 and an exhaust port 24, and a first heating means 26 and a second heating means 27 which are placed around the reaction chamber 20 to heat predetermined regions in the reaction chamber 20.

The film growth rate when using the HVPE technique is higher than that in the PLD method, etc. In addition, in-plane distribution of film thickness is highly uniform and it is possible to grow a large-diameter film. Therefore, it is suitable for mass production of crystal.

The reaction chamber 20 has a source reaction region R1 in which a reaction container 25 containing a Ga material is placed and a gallium source gas is produced, and a crystal growth region R2 in which the semiconductor substrate 11 is placed and the epitaxial layer 12 is grown thereon. The reaction chamber 20 is formed of, e.g., quartz glass.

Here, the reaction container 25 is formed of, e.g., quartz glass and the Ga material contained in the reaction container 25 is metal gallium.

The first heating means 26 and the second heating means 27 are capable of respectively heating the source reaction region R1 and the crystal growth region R2 of the reaction chamber 20. The first heating means 26 and the second heating means 27 are, e.g., resistive heaters or radiation heaters.

The first gas introducing port 21 is a port for introducing a Cl-containing gas ($Cl_2$ gas or HCl gas) into the source reaction region R1 of the reaction chamber 20 using an inert carrier gas ($N_2$ gas, Ar gas or He gas).

The second gas introducing port 22 is a port for introducing an oxygen-containing gas ($O_2$ gas or $H_2O$ gas, etc.) as an oxygen source gas and a chloride gas (e.g., silicon tetrachloride, etc.) used to add a dopant such as Si to the epitaxial layer 12, into the crystal growth region R2 of the reaction chamber 20 using an inert carrier gas ($N_2$ gas, Ar gas or He gas).

The third gas introducing port 23 is a port for introducing an inert carrier gas ($N_2$ gas, Ar gas or He gas) into the crystal growth region R2 of the reaction chamber 20.

(Growth of Epitaxial Layer)

A process of growing the epitaxial layer 12 in the present embodiment will be described below as an example.

Firstly, the source reaction region R1 of the reaction chamber 20 is heated by the first heating means 26 and an atmosphere temperature in the source reaction region R1 is then maintained at a predetermined temperature.

Next, in the source reaction region R1, a Cl-containing gas introduced through the first gas introducing port 21 using a carrier gas is reacted with the metal gallium in the reaction container 25 at the above-mentioned atmosphere temperature, thereby producing a gallium chloride gas.

The atmosphere temperature in the source reaction region R1 here is preferably a temperature at which GaCl gas has the highest partial pressure among component gases of the gallium chloride gas produced by the reaction of the metal gallium in the reaction container 25 with the Cl-containing gas. The gallium chloride gas here contains GaCl gas, $GaCl_2$ gas, $GaCl_3$ gas and $(GaCl_3)_2$ gas, etc.

The temperature at which a driving force for growth of $Ga_2O_3$ crystal is maintained is the highest with the GaCl gas among the gases contained in the gallium chloride gas. Growth at a high temperature is effective to obtain a high-quality $Ga_2O_3$ crystal with high purity. Therefore, for growing the epitaxial layer 12, it is preferable to produce a gallium chloride gas in which a partial pressure of GaCl gas having a high driving force for growth at a high temperature is high.

If hydrogen is contained in an atmosphere for growing the epitaxial layer 12, surface flatness and a driving force for crystal growth of the epitaxial layer 12 decrease. Therefore, it is preferable that a $Cl_2$ gas not containing hydrogen be used as the Cl-containing gas.

In addition, to increase a partial pressure ratio of the GaCl gas in the gallium chloride gas, it is preferable that the metal gallium in the reaction container 25 be reacted with the Cl-containing gas in a state that the atmosphere temperature in the source reaction region R1 is maintained at not less than 300° C. by using the first heating means 26.

Meanwhile, at the atmosphere temperature of, e.g., 850° C., the partial pressure ratio of the GaCl gas is predominantly high (the equilibrium partial pressure of the GaCl gas is four orders of magnitude greater than the $GaCl_2$ gas and is eight orders of magnitude greater than the $GaCl_3$ gas) and the gases other than GaCl gas hardly contribute to the growth of $Ga_2O_3$ crystal.

Considering the lifetime of the first heating means 26 and heat resistance of the reaction chamber 20 formed of quartz glass, etc., it is preferable that the metal gallium in the reaction container 25 be reacted with the Cl-containing gas in a state that the atmosphere temperature in the source reaction region R1 is maintained at not more than 1000° C.

Next, in the crystal growth region R2, the gallium chloride gas produced in the source reaction region R1 is mixed with the oxygen-containing gas introduced through the second gas introducing port 22 and the semiconductor substrate 11 is exposed to the resulting mixed gas, thereby epitaxially growing the epitaxial layer 12 on the semiconductor substrate 11. At this time, in a furnace housing the reaction chamber 20, pressure in the crystal growth region R2 is maintained at, e.g., 1 atm.

When forming the epitaxial layer 12 containing an additive element such as Si or Al, a source gas of the additive element (e.g., a chloride gas such as silicon tetrachloride ($SiCl_4$)) is introduced, together with the gallium chloride gas and the oxygen-containing gas, into the crystal growth region R2 through the gas introducing port 22.

If hydrogen is contained in an atmosphere for growing the epitaxial layer 12, surface flatness and a driving force for crystal growth of the epitaxial layer 12 decrease. Therefore, it is preferable that an $O_2$ gas not containing hydrogen be used as the oxygen-containing gas.

In addition, to suppress a decrease in the equilibrium partial pressure of the GaCl gas and to efficiently grow the epitaxial layer 12, the epitaxial layer 12 is preferably grown in a state that a ratio of the supplied partial pressure of the $O_2$ gas to the supplied partial pressure of the GaCl gas in the crystal growth region R2 is not less than 0.5.

In addition, the growth temperature is preferably not less than 900° C. to grow a high-quality epitaxial layer 12.

The epitaxial layer 12 contains, e.g., not more than $5 \times 10^{16}$ (atoms/$cm^3$) of Cl. This results from that the epitaxial layer 12 is formed by the HVPE method using Cl-containing gas. Generally, Cl-containing gas is not used to form a $Ga_2O_3$ single crystal film when using a method other than the HVPE method, and the $Ga_2O_3$ single crystal film does not contain Cl, or at least does not contain $1 \times 10^{16}$ (atoms/$cm^3$) or more of Cl.

(Plane Orientation of Principal Surface of Semiconductor Substrate)

A relation between the plane orientation of the principal surface of the semiconductor substrate 11 and the growth rate of the epitaxial layer 12 was evaluated, and the results are as follows. This evaluation was conducted using a $\beta$-$Ga_2O_3$ single crystal substrate on which mesa and recessed portions in a line-and-space pattern are formed on the (010)-oriented principal surface.

Figure 3A:
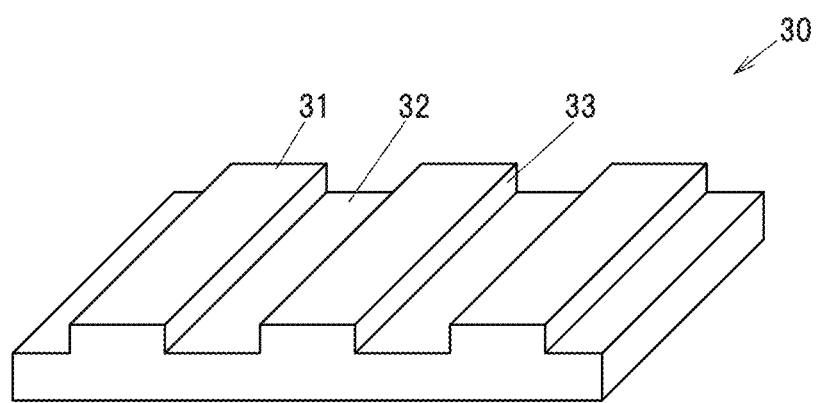
FIG. 3A is a perspective view showing a portion of a principal surface of a $\beta$-$Ga_2O_3$ single crystal substrate used for evaluation.
Figure 3B:
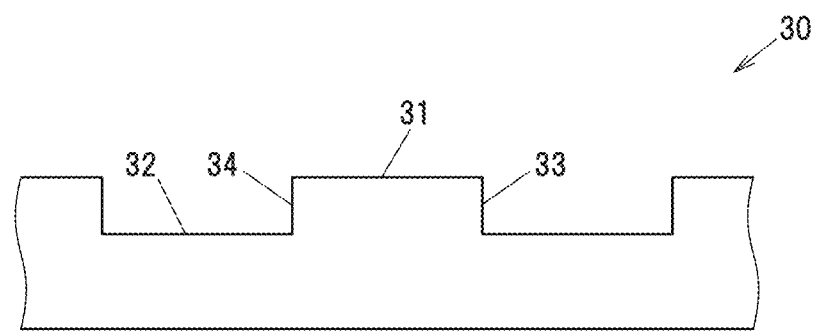
FIG. 3B is a side view showing a portion of the principal surface of the $\beta$-$Ga_2O_3$ single crystal substrate used for evaluation.

FIGS. 3A and 3B are a perspective view and a side view which show a portion of the principal surface of a $\beta$-$Ga_2O_3$ single crystal substrate 30 used for evaluation. On the principal surface of the $\beta$-$Ga_2O_3$ single crystal substrate 30, an upper surface of a mesa portion is defined as a surface 31, a bottom surface of a recessed portion as a surface 32, and side surfaces of the mesa portion as surfaces 33 and 34.

The plane orientation of the surfaces 31 and 32 is (010). The surfaces 33 and 34 are perpendicular to the surfaces 31 and 32 and are planes rotated by an angle $\theta$ from a (100) plane toward a (101) plane about the [010] axis. The plane orientation of the surface 34 is further rotated by 180° from $\theta$ and is equivalent to the plane orientation of the surface 33.

A $\beta$-$Ga_2O_3$ single crystal was epitaxially grown on the $\beta$-$Ga_2O_3$ single crystal substrate 30 by the HVPE method while observing the growth of the $\beta$-$Ga_2O_3$ single crystal in a direction perpendicular to the surfaces 33 and 34. Then, a relation between the plane orientation of the plane parallel to the [010] axis and the growth rate of the $\beta$-$Ga_2O_3$ single crystal was evaluated.

Figure 4A:
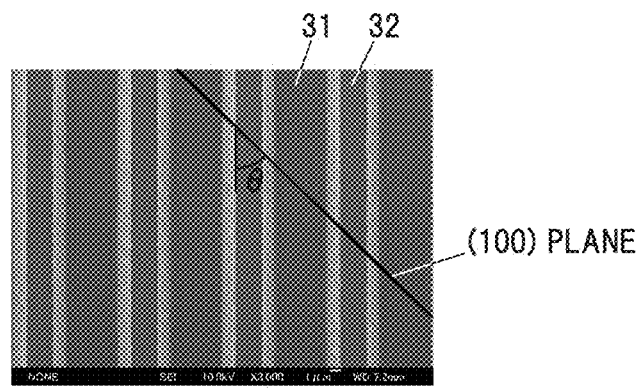
FIG. 4A is an SEM observation image showing a $\beta$-$Ga_2O_3$ single crystal substrate with θ=38°.
Figure 4B:
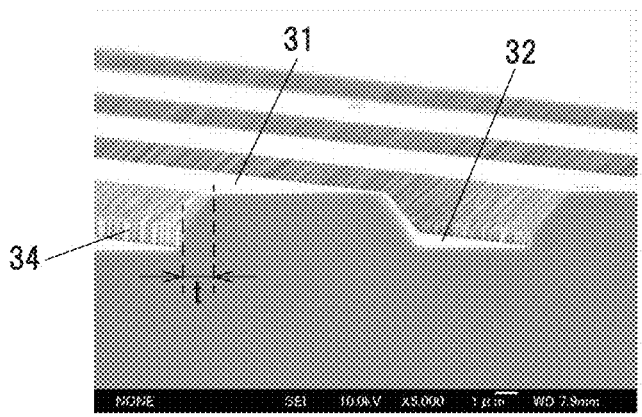
FIG. 4B is an SEM observation image showing the $\beta$-$Ga_2O_3$ single crystal substrate with θ=38°.

FIGS. 4A and 4B are SEM (Scanning Electron Microscope) observation images showing the $\beta$-$Ga_2O_3$ single crystal substrate 30 with $\theta=38°$. FIG. 4A is an image observed in a direction perpendicular to the principal surface and FIG. 4B is an image observed from obliquely above.

Figure 5A:
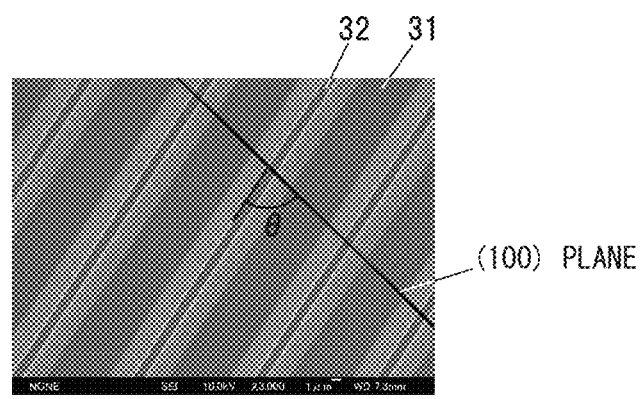
FIG. 5A is an SEM observation image showing a $\beta$-$Ga_2O_3$ single crystal substrate with θ=68°.
Figure 5B:
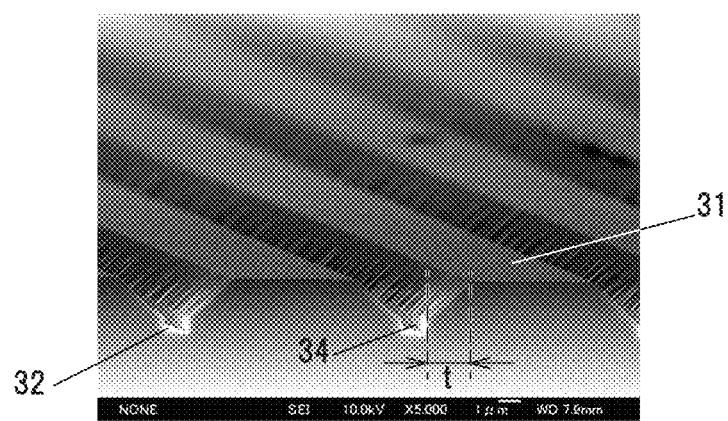
FIG. 5B is an SEM observation image showing the $\beta$-$Ga_2O_3$ single crystal substrate with θ=68°.

FIGS. 5A and 5B are SEM observation images showing the $\beta$-$Ga_2O_3$ single crystal substrate 30 with $\theta=68°$. FIG. 5A is an image observed in a direction perpendicular to the principal surface and FIG. 5B is an image observed from obliquely above.

Figure 6A:
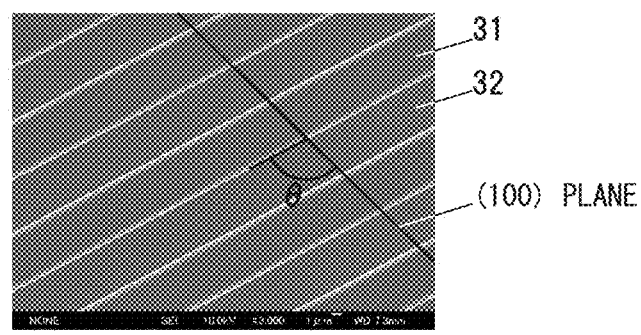
FIG. 6A is an SEM observation image showing a $\beta$-$Ga_2O_3$ single crystal substrate with θ=98°.
Figure 6B:
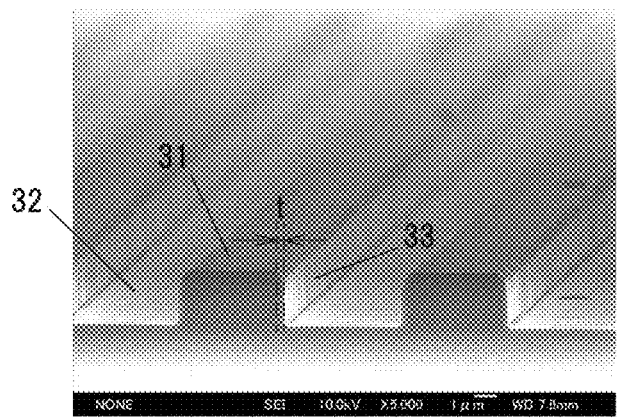
FIG. 6B is an SEM observation image showing the $\beta$-$Ga_2O_3$ single crystal substrate with θ=98°.

FIGS. 6A and 6B are SEM observation images showing the $\beta$-$Ga_2O_3$ single crystal substrate 30 with $\theta=98°$. FIG. 6A is an image observed in a direction perpendicular to the principal surface and FIG. 6B is an image observed from obliquely above.

The thickness t shown in FIGS. 4B, 5B and 6B indicates a thickness of the $\beta$-$Ga_2O_3$ single crystal grown in a direction perpendicular to the surfaces 33 and 34.

Figure 7:
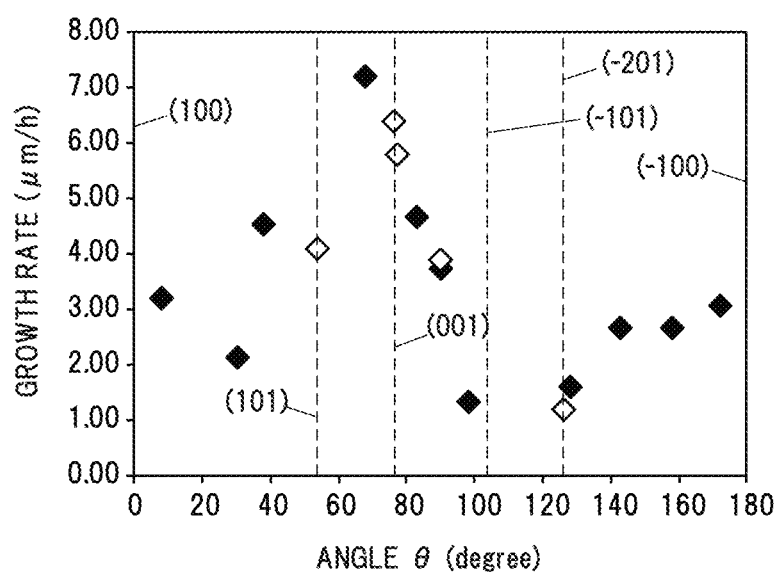
FIG. 7 is a graph which is obtained by the evaluation and shows a relation between the growth rate of the $\beta$-$Ga_2O_3$ single crystal grown by the HVPE method and the plane orientation of a base substrate.

FIG. 7 is a graph which is obtained by the evaluation and shows a relation between the growth rate of the $\beta$-$Ga_2O_3$ single crystal grown by the HVPE method and the plane orientation of a base substrate. In FIG. 7, the horizontal axis indicates the angle $\theta$ of the surface 33 and the vertical axis indicates the growth rate of the $\beta$-$Ga_2O_3$ single crystal in a direction perpendicular to the surfaces 33 and 34 (an increase in the thickness t per unit time).

Dotted lines in FIG. 7 indicate the angles $\theta$ corresponding to a (010) plane, a (001) plane, a (−101) plane and a (−201) plane, and it is shown that when, e.g., $\theta=53.8°$, the surface 33 coincides with the (101) plane and the surface 34 with the (−10−1) plane.

Plot symbols ◆ in FIG. 7 are the measured values based on the evaluation using the above-mentioned $\beta$-$Ga_2O_3$ single crystal substrate 30. Plot symbols ◇ are the measured values obtained by observing the growth in a direction perpendicular to the principal surface when the β-Ga₂O₃ single crystal substrate 30 was not used and a β-Ga₂O₃ single crystal was grown on a β-Ga₂O₃ single crystal substrate having a flat principal surface with the plane orientation equivalent to the β-Ga₂O₃ single crystal substrate 30.

The numerical values of the measurement points in FIG. 7 are shown in Table 1 below.

TABLE 1

| Angle θ (degree) | Growth rate (μm/h) |
|---|---|
| 8.0 | 3.20 |
| 30.5 | 2.13 |
| 38.0 | 4.53 |
| 53.8 | 4.10 |
| 68.0 | 7.20 |
| 76.3 | 6.40 |
| 77.3 | 5.80 |
| 83.0 | 4.67 |
| 90.0 | 3.90 |
| 90.0 | 3.73 |
| 98.0 | 1.33 |
| 126.2 | 1.20 |
| 128.0 | 1.60 |
| 143.0 | 2.67 |
| 158.0 | 2.67 |
| 172.0 | 3.07 |

When a β-Ga₂O₃ single crystal was grown on a β-Ga₂O₃ single crystal substrate having a (010)-oriented principal surface under the same growth conditions, the growth rate of the β-Ga₂O₃ single crystal in a direction perpendicular to the principal surface was 0.3 μm/h.

As shown in FIG. 7 and Table 1, the growth rate of the β-Ga₂O₃ single crystal grown on a plane parallel to the [010] axis is significantly higher than the growth rate on the (010) plane in the entire range of 0°≤θ≤180°. For example, even 1.20 μm/h (at θ=126.2) shown in FIG. 7 and Table 1, which is the lowest growth rate of the β-Ga₂O₃ single crystal grown on the plane parallel to the [010] axis, is the four times of 0.3 μm/h which is the growth rate on the (010) plane. This shows that the growth rate of the β-Ga₂O₃ single crystal epitaxially grown by the HVPE method is high when the principal surface of the β-Ga₂O₃ single crystal substrate is a plane parallel to the [010] axis.

In addition, the growth rate of the β-Ga₂O₃ single crystal is especially high in the range of 38°≤θ≤90°, as shown in FIG. 7 and Table 1.

Furthermore, in the range of 38°≤θ≤90°, there is a tendency that the growth rate of the β-Ga₂O₃ single crystal is higher when the angle θ is closer to around 68°, and it is thus presumed that the high growth rate is obtained especially in the range of 68±10°.

In addition, the growth rate does not greatly change as long as the inclination of the principal surface of the β-Ga₂O₃ single crystal substrate is within ±1°. Therefore, based on the actually measured values, it can be said that the growth rate of the β-Ga₂O₃ single crystal is high when θ=38±1°, 53.8±1°, 68±1°, 76.3±1°, 77.3±1°, 83±1° or 90±1°.

Although the above evaluation was conducted on the β-Ga₂O₃ single crystal grown on the β-Ga₂O₃ single crystal substrate, similar results are obtained also when using another β-Ga₂O₃-based single crystal as a substrate material and a crystal to be grown instead of using the β-Ga₂O₃ single crystal or when using a β-Ga₂O₃-based single crystal containing a dopant.

This means that, to increase the growth rate of the epitaxial layer 12 epitaxially grown by the HVPE method, the principal surface of the semiconductor substrate 11 of the epitaxial wafer 10 is preferably a plane parallel to the [010] axis.

In addition, the principal surface of the semiconductor substrate 11 is more preferably a plane rotated by an angle within a range of not less than 38° and not more than 90° from a (100) plane toward a (101) plane about the [010] axis of the β-Ga₂O₃-based single crystal.

Further preferably, the principal surface of the semiconductor substrate 11 is a plane rotated by 68±10° from a (100) plane toward a (101) plane about the [010] axis of the β-Ga₂O₃-based single crystal.

It is also preferable that the principal surface of the semiconductor substrate 11 be a plane rotated by 38±1°, 53.8±1°, 68±1°, 76.3±1°, 77.3±1°, 83±1° or 90±1° from a (100) plane toward a (101) plane about the [010] axis of the β-Ga₂O₃-based single crystal.

[Second Embodiment]

The second embodiment is an embodiment of a semiconductor element including the epitaxial wafer 10 in the first embodiment. A lateral transistor having a MISFET (Metal Semiconductor Field Effect Transistor) structure will be described below as an example of such a semiconductor element.

(Configuration of Semiconductor Element)

Figure 8:
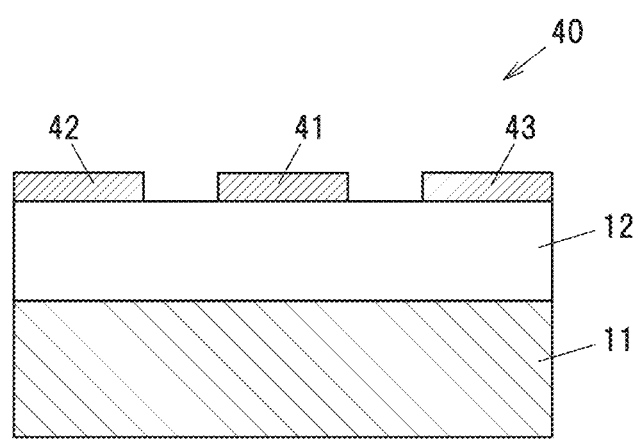
FIG. 8 is a vertical cross-sectional view showing a lateral transistor in a second embodiment.

FIG. 8 is a vertical cross-sectional view showing a lateral transistor 40 in the second embodiment. The lateral transistor 40 includes the epitaxial layer 12 formed on the semiconductor substrate 11, and a gate electrode 41, a source electrode 42 and a drain electrode 43 which are provided on the epitaxial layer 12. The gate electrode 41 is arranged between the source electrode 42 and the drain electrode 43.

The source electrode 42 and the drain electrode 43 are in contact with an upper surface of the epitaxial layer 12 (a surface opposite to the surface in contact with the semiconductor substrate 11) and form ohmic junctions. Meanwhile, the gate electrode 41 is in contact with the upper surface of the epitaxial layer 12 and forms a Schottky junction, and a depletion layer is thereby formed in the epitaxial layer 12 under the gate electrode 41. The lateral transistor 40 functions as either a normally-off transistor or a normally-on transistor depending on the thickness of this depletion region.

The semiconductor substrate 11 is formed of a β-Ga₂O₃-based crystal containing a p-type dopant such as Mg, Be, Zn or Fe, and has high electrical resistance.

The epitaxial layer 12 contains an n-type dopant such as Si or Sn. The n-type dopant concentration is higher around the contact portion with the source electrode 42 and the drain electrode 43 than in other portions. The thickness of the epitaxial layer 12 is, e.g., 0.1 to 1 μm.

The gate electrode 41, the source electrode 42 and the drain electrode 43 are formed of, e.g., a metal such as Au, Al, Ti, Sn, Ge, In, Ni, Co, Pt, W, Mo, Cr, Cu and Pb, an alloy containing two or more of such metals, a conductive compound such as ITO, or a conductive polymer. The conductive polymer to be used is, e.g., a polythiophene derivative (PEDOT: poly(3,4)-ethylenedioxythiophene) doped with polystyrene sulfonate (PSS) or a polypyrrole derivative doped with TCNA, etc. In addition, the gate electrode 41 may have a two-layer structure composed of two different metals, e.g., Al/Ti, Au/Ni or Au/Co.

In the lateral transistor 40, the thickness of the depletion layer in the epitaxial layer 12 under the gate electrode 41 is changed by controlling bias voltage applied to the gate electrode 41, thereby controlling a drain current.

The lateral transistor 40 described above is an example of the semiconductor element including the epitaxial wafer 10 in the first embodiment, and the epitaxial wafer 10 can be used to manufacture various other semiconductor elements.

It is possible to manufacture, e.g., MISFET (Metal Insulator Semiconductor Field Effect Transistor) and HEMT (High Electron Mobility Transistor) in which the epitaxial layer 12 is used as a channel layer, and Schottky diode in which the semiconductor substrate 11 and the epitaxial layer 12 are respectively connected to an ohmic electrode and a Schottky electrode. Type and concentration of dopant contained in the semiconductor substrate 11 and the epitaxial layer 12 are appropriately determined according to the type of semiconductor element to be manufactured.

(Effects of the Embodiments)

According to the embodiments described above, it is possible to provide a semiconductor substrate comprising a $\beta$-Ga$_2$O$_3$ single crystal on which an epitaxial layer comprising a $\beta$-Ga$_2$O$_3$ single crystal can be made to grow at a high growth rate using the HVPE method.

In addition, by epitaxially growing an epitaxial layer on such semiconductor substrate, it is possible to efficiently manufacture an epitaxial wafer. Furthermore, since diffusion of impurities from the semiconductor substrate is reduced by growing the epitaxial layer at a high growth rate, the epitaxial layer of this epitaxial wafer has a high quality.

Furthermore, it is possible to efficiently manufacture a high-quality semiconductor element by using such epitaxial wafer.

Although the embodiments of the invention have been described, the invention is not intended to be limited to the embodiments, and the various kinds of modifications can be implemented without departing from the gist of the invention.

In addition, the invention according to claims is not to be limited to the embodiments described above. Further, it should be noted that all combinations of the features described in the embodiments are not necessary to solve the problem of the invention.

INDUSTRIAL APPLICABILITY

Provided are a semiconductor substrate comprising a $\beta$-Ga$_2$O$_3$ single crystal on which an epitaxial layer comprising a $\beta$-Ga$_2$O$_3$ single crystal can be made to grow at a high growth rate using the HVPE method; an epitaxial wafer comprising such semiconductor substrate and an epitaxial layer; and a method for manufacturing such epitaxial wafer.

REFERENCE SIGNS LIST

10 EPITAXIAL WAFER
11 SEMICONDUCTOR SUBSTRATE
12 EPITAXIAL LAYER

The invention claimed is:

1. An epitaxial wafer, comprising:
   a semiconductor substrate for use as a base substrate for HVPE epitaxial crystal growth, the semiconductor substrate comprising a $\beta$-Ga$_2$O$_3$-based single crystal and a principal surface that is a plane parallel to a [010] axis of the $\beta$-Ga$_2$O$_3$-based single crystal; and
   an epitaxial layer that comprises a $\beta$-Ga$_2$O$_3$-based single crystal and is formed on the principal surface of the semiconductor substrate wherein the $\beta$-Ga$_2$O$_3$-based single crystal in the epitaxial layer contains not less than $1\times10^{16}$ atoms/cm$^3$ and not more than $5\times10^{16}$ atoms/cm$^3$ of Cl.

2. An epitaxial wafer according to claim 1, wherein the principal surface is a plane rotated by an angle within a range of not less than 38° and not more than 90° from a (100) plane toward a (101) plane about a rotational axis the axis of the $\beta$-Ga$_2$O$_3$-based single crystal.

3. An epitaxial wafer according to claim 2, wherein the angle is 68±10°.

4. An epitaxial wafer according to claim 2 wherein the angle is 38-39°, 53.8±1°, 68±1°, 76.3±1°, 77.3±1°, 83±1° or 89-90°.

* * * * *